United States Patent
Wang et al.

(10) Patent No.: US 11,830,734 B2
(45) Date of Patent: Nov. 28, 2023

(54) THERMAL DEPOSITION OF SILICON-GERMANIUM

(71) Applicant: Applied Materials, Inc., Santa Clara, CA (US)

(72) Inventors: Huiyuan Wang, Santa Clara, CA (US); Susmit Singha Roy, Sunnyvale, CA (US); Abhijit Basu Mallick, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 266 days.

(21) Appl. No.: 17/324,352

(22) Filed: May 19, 2021

(65) Prior Publication Data
US 2022/0375750 A1    Nov. 24, 2022

(51) Int. Cl.
*H01L 21/02* (2006.01)
*H01L 21/3205* (2006.01)

(52) U.S. Cl.
CPC .... *H01L 21/02532* (2013.01); *H01L 21/0243* (2013.01); *H01L 21/0245* (2013.01);
(Continued)

(58) Field of Classification Search
CPC ........... H01L 21/02381; H01L 21/0243; H01L 21/02436; H01L 21/0245; H01L 21/02491;
(Continued)

(56) References Cited

U.S. PATENT DOCUMENTS

2005/0079691 A1*  4/2005  Kim ................... H01L 21/02579
                                                            438/481
2008/0113186 A1   5/2008  Kouvetakis et al.
(Continued)

FOREIGN PATENT DOCUMENTS

CN           101057008 B     7/2013
CN           111540667 A     8/2020
(Continued)

OTHER PUBLICATIONS

International Search Report and Written Opinion dated Sep. 8, 2022 in International Patent Application No. PCT/US2022/029777, 10 pages.

*Primary Examiner* — Cheung Lee
(74) *Attorney, Agent, or Firm* — Kilpatrick Townsend & Stockton LLP (57) ABSTRACT

Exemplary methods of semiconductor processing may include providing a silicon-containing precursor to a processing region of a semiconductor processing chamber. A substrate may be disposed within the processing region of the semiconductor processing chamber. The methods may include depositing a silicon-containing material on the substrate. Subsequent a first period of time, the methods may include providing a germanium-containing precursor to the processing region of the semiconductor processing chamber. The methods may include thermally reacting the silicon-containing precursor and the germanium-containing precursor at a temperature greater than or about 400° C. The methods may include forming a silicon-and-germanium-containing layer on the substrate.

19 Claims, 4 Drawing Sheets

(52) U.S. Cl.
CPC .... *H01L 21/0262* (2013.01); *H01L 21/02381* (2013.01); *H01L 21/02488* (2013.01); *H01L 21/02502* (2013.01); *H01L 21/02612* (2013.01); *H01L 21/02658* (2013.01); *H01L 21/3205* (2013.01)

(58) Field of Classification Search
CPC ......... H01L 21/02496; H01L 21/02502; H01L 21/02518; H01L 21/02532; H01L 21/02612; H01L 21/0262; H01L 21/02658; H01L 21/02697; H01L 21/3003; H01L 21/3205
See application file for complete search history.

(56) References Cited

U.S. PATENT DOCUMENTS

| | | |
|---|---|---|
| 2011/0177681 A1 | 7/2011 | Fitzgerald et al. |
| 2015/0325435 A1 | 11/2015 | Hollister et al. |
| 2017/0365467 A1* | 12/2017 | Shimamoto ............. C23C 16/28 |
| 2020/0144058 A1 | 5/2020 | Kohen |
| 2020/0251334 A1 | 8/2020 | Fabreguette et al. |

FOREIGN PATENT DOCUMENTS

| | | |
|---|---|---|
| TW | 200602514 A | 1/2006 |
| TW | 201411722 A | 3/2014 |
| TW | 202029294 A | 8/2020 |

\* cited by examiner

THERMAL DEPOSITION OF SILICON-GERMANIUM

TECHNICAL FIELD

The present technology relates to methods and components for semiconductor processing. More specifically, the present technology relates to systems and methods for producing silicon-germanium films for semiconductor structures.

BACKGROUND

Integrated circuits are made possible by processes which produce intricately patterned material layers on substrate surfaces. Producing patterned material on a substrate requires controlled methods for forming and removing material. As device sizes continue to reduce, aspect ratios of structures may grow, and maintaining dimensions of these structures during processing operations may be challenged. Developing materials that may have sufficient conformality across features may become more difficult. Additionally, as the number of material layers being patterned during processing is expanding, producing materials that may have improved removal selectivity to other exposed materials is becoming a greater challenge, along with maintaining material properties.

Thus, there is a need for improved systems and methods that can be used to produce high quality devices and structures. These and other needs are addressed by the present technology.

SUMMARY

Exemplary methods of semiconductor processing may include providing a silicon-containing precursor to a processing region of a semiconductor processing chamber. A substrate may be disposed within the processing region of the semiconductor processing chamber. The methods may include depositing a silicon-containing material on the substrate. Subsequent a first period of time, the methods may include providing a germanium-containing precursor to the processing region of the semiconductor processing chamber. The methods may include thermally reacting the silicon-containing precursor and the germanium-containing precursor at a temperature greater than or about 400° C. The methods may include forming a silicon-and-germanium-containing layer on the substrate.

In some embodiments, the processing region of the semiconductor processing chamber may be maintained plasma-free while forming the silicon-and-germanium-containing layer on the substrate. The first period of time may be less than or about 60 seconds. The methods may include increasing a flow rate of the silicon-containing precursor when providing the germanium-containing precursor. Thermally reacting the silicon-containing precursor and the germanium-containing precursor may be performed at a temperature greater than or about 500° C. Prior to providing the silicon-containing precursor. the methods may include forming a plasma of a treatment precursor. The methods may include contacting the substrate with plasma effluents of the treatment precursor. The treatment precursor may include at least one of a hydrogen-containing precursor or a nitrogen-containing precursor. The methods may include halting formation of the plasma prior to providing the silicon-containing precursor to the processing region. The methods may include increasing a pressure within the semiconductor processing chamber prior to or while providing the silicon-containing precursor to the processing region. The methods may include reducing a distance between the substrate and a faceplate within the semiconductor processing chamber prior to or while providing the silicon-containing precursor to the processing region.

Some embodiments of the present technology may encompass semiconductor processing methods. The methods may include forming a plasma of a treatment precursor. The methods may include contacting a substrate with plasma effluents of the treatment precursor. The substrate may be disposed within a processing region of a semiconductor processing chamber. The methods may include providing a silicon-containing precursor to the processing region of the semiconductor processing chamber. The methods may include subsequently providing a germanium-containing precursor to the processing region of the semiconductor processing chamber. The methods may include reacting the silicon-containing precursor and the germanium-containing precursor within the processing region of the semiconductor processing chamber. The methods may include forming a silicon-and-germanium-containing layer on the substrate.

In some embodiments, the processing region of the semiconductor processing chamber may be maintained plasma-free while providing the silicon-containing precursor and while providing the germanium-containing precursor. The methods may include maintaining delivery of the silicon-containing precursor while providing the germanium-containing precursor. The germanium-containing precursor may be provided after at least about 5 seconds subsequent providing the silicon-containing precursor. The methods may include increasing a flow rate of the silicon-containing precursor when providing the germanium-containing precursor. The semiconductor processing method may be performed at a temperature within the processing region of greater than or about 400° C. The methods may include increasing a pressure within the semiconductor processing chamber prior to or while providing the silicon-containing precursor to the processing region.

Some embodiments of the present technology may encompass semiconductor processing methods. The methods may include forming a plasma of a treatment precursor. The methods may include contacting a substrate with plasma effluents of the treatment precursor. The substrate may be disposed within a processing region of a semiconductor processing chamber. The methods may include providing a silicon-containing precursor to the processing region of the semiconductor processing chamber. The methods may include forming a layer of silicon-containing material on the substrate. The methods may include, subsequent a first period of time, providing a germanium-containing precursor to the processing region of the semiconductor processing chamber. The methods may include reacting the silicon-containing precursor and the germanium-containing precursor within the processing region of the semiconductor processing chamber. The methods may include forming a silicon-and-germanium-containing layer on the substrate overlying the layer of silicon-containing material. In some embodiments, the processing region of the semiconductor processing chamber may be maintained plasma-free while providing the silicon-containing precursor and while providing the germanium-containing precursor. The first period of time may be less than or about 60 seconds.

Such technology may provide numerous benefits over conventional systems and techniques. For example, embodiments of the present technology may produce conformal materials applicable to a number of substrate features.

Additionally, the present technology may produce silicon-germanium films for plug and gapfill applications, as well as any other application for which more uniform deposition may be a benefit. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

As device sizes continue to shrink, many material layers may be reduced in thickness and size to scale devices. Aspect ratios may also increase, and more selective material formation may be performed. These materials may be used in gapfill and other deposition operations to separate and/or protect other materials. Additionally, as the number of materials on a surface to be processed may increase, newer materials may be utilized to increase selectivity during subsequent removal or processing. As one non-limiting example, silicon-germanium may be utilized in applications as an alternative to more conventional silicon oxide or other gapfill materials. However, incorporating germanium may challenge producing conformation formation along various device structures.

Conventional technologies have struggled to produce germanium-containing materials that may conform to device structures. Blanket deposition of silicon-germanium, for example, may cause air gaps and voids to develop in devices being produced, which may include trenches, plugs, or other structures that may be characterized by increased aspect ratios. Additionally, conformal formation with germanium may be challenged due to several aspects related to germanium. For example, as compared to silicon, germanium may be characterized by a lower melting point and a less thermally stable formation. Additionally, germanium materials may be less likely to nucleate on certain structures. For example, germanium may have a higher affinity to certain materials over others, which may cause an island-like formation during deposition. This may limit conformal formation, and may create additional voids and gaps in coverage. Accordingly, many conventional technologies have been limited in the ability to incorporate silicon-germanium films.

The present technology overcomes these issues by performing a thermally-based material deposition overlying a seeding layer of a material on which silicon-germanium may more readily form conformally. By performing a thermal reaction to produce silicon-germanium after producing a seed or initiation layer, the present technology may allow improved germanium-containing film coverage, which may afford conformal growth on any number of semiconductor structures. Although the remaining disclosure will routinely identify specific deposition processes utilizing the disclosed technology, and will describe one type of semiconductor processing chamber, it will be readily understood that the processes described may be performed in any number of semiconductor processing chambers. Accordingly, the technology should not be considered to be so limited as for use with these specific deposition processes or chambers alone. The disclosure will discuss one possible chamber that may be used to perform processes according to embodiments of the present technology before methods of semiconductor processing according to the present technology are described.

Figure 1:
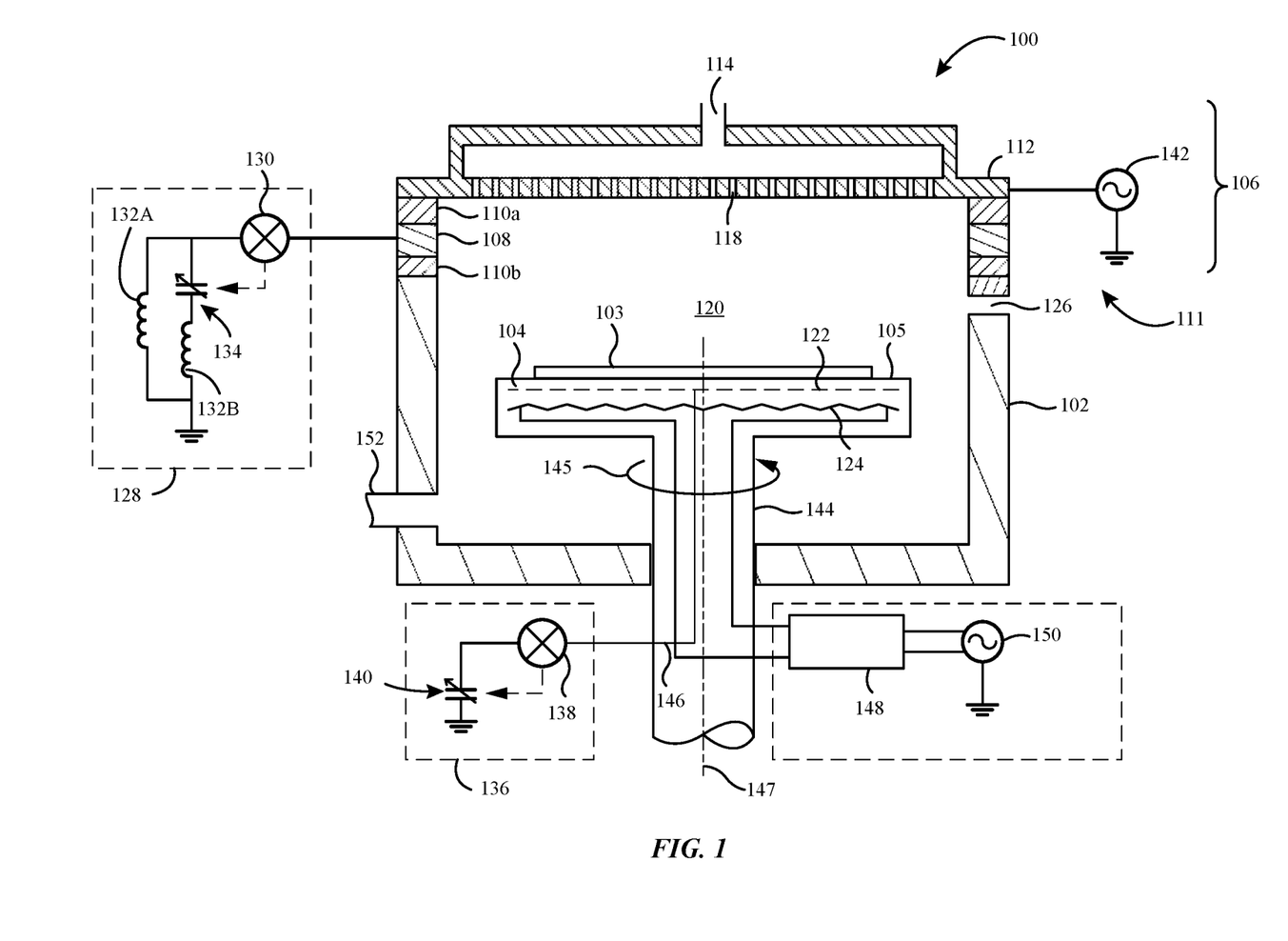
FIG. 1 shows a schematic cross-sectional view of an exemplary plasma system according to some embodiments of the present technology.

FIG. 1 shows a cross-sectional view of an exemplary processing chamber 100 according to some embodiments of the present technology. The figure may illustrate an overview of a system incorporating one or more aspects of the present technology, and/or which may be specifically configured to perform one or more operations according to embodiments of the present technology. Additional details of chamber 100 or methods performed may be described further below. Chamber 100 may be utilized to form film layers according to some embodiments of the present technology, although it is to be understood that the methods may similarly be performed in any chamber within which film formation may occur. The processing chamber 100 may include a chamber body 102, a substrate support 104 disposed inside the chamber body 102, and a lid assembly 106 coupled with the chamber body 102 and enclosing the substrate support 104 in a processing volume 120. A substrate 103 may be provided to the processing volume 120 through an opening 126, which may be conventionally sealed for processing using a slit valve or door. The substrate 103 may be seated on a surface 105 of the substrate support during processing. The substrate support 104 may be rotatable, as indicated by the arrow 145, along an axis 147, where a shaft 144 of the substrate support 104 may be located. Alternatively, the substrate support 104 may be lifted up to rotate as necessary during a deposition process.

A plasma profile modulator 111 may be disposed in the processing chamber 100 to control plasma distribution across the substrate 103 disposed on the substrate support 104. The plasma profile modulator 111 may include a first electrode 108 that may be disposed adjacent to the chamber body 102, and may separate the chamber body 102 from other components of the lid assembly 106. The first electrode 108 may be part of the lid assembly 106, or may be a separate sidewall electrode. The first electrode 108 may be an annular or ring-like member, and may be a ring electrode. The first electrode 108 may be a continuous loop around a circumference of the processing chamber 100 surrounding the processing volume 120, or may be discontinuous at selected locations if desired. The first electrode 108 may also be a perforated electrode, such as a perforated ring or a mesh electrode, or may be a plate electrode, such as, for example, a secondary gas distributor.

One or more isolators 110a, 110b, which may be a dielectric material such as a ceramic or metal oxide, for example aluminum oxide and/or aluminum nitride, may contact the first electrode 108 and separate the first electrode 108 electrically and thermally from a gas distributor 112 and from the chamber body 102. The gas distributor 112 may define apertures 118 for distributing process precursors into the processing volume 120. The gas distributor 112 may be coupled with a first source of electric power 142, such as an RF generator, RF power source, DC power source, pulsed DC power source, pulsed RF power source, or any other power source that may be coupled with the processing chamber. In some embodiments, the first source of electric power 142 may be an RF power source.

The gas distributor 112 may be a conductive gas distributor or a non-conductive gas distributor. The gas distributor 112 may also be formed of conductive and non-conductive components. For example, a body of the gas distributor 112 may be conductive while a face plate of the gas distributor 112 may be non-conductive. The gas distributor 112 may be powered, such as by the first source of electric power 142 as shown in FIG. 1, or the gas distributor 112 may be coupled with ground in some embodiments.

The first electrode 108 may be coupled with a first tuning circuit 128 that may control a ground pathway of the processing chamber 100. The first tuning circuit 128 may include a first electronic sensor 130 and a first electronic controller 134. The first electronic controller 134 may be or include a variable capacitor or other circuit elements. The first tuning circuit 128 may be or include one or more inductors 132. The first tuning circuit 128 may be any circuit that enables variable or controllable impedance under the plasma conditions present in the processing volume 120 during processing. In some embodiments as illustrated, the first tuning circuit 128 may include a first circuit leg and a second circuit leg coupled in parallel between ground and the first electronic sensor 130. The first circuit leg may include a first inductor 132A. The second circuit leg may include a second inductor 132B coupled in series with the first electronic controller 134. The second inductor 132B may be disposed between the first electronic controller 134 and a node connecting both the first and second circuit legs to the first electronic sensor 130. The first electronic sensor 130 may be a voltage or current sensor and may be coupled with the first electronic controller 134, which may afford a degree of closed-loop control of plasma conditions inside the processing volume 120.

A second electrode 122 may be coupled with the substrate support 104. The second electrode 122 may be embedded within the substrate support 104 or coupled with a surface of the substrate support 104. The second electrode 122 may be a plate, a perforated plate, a mesh, a wire screen, or any other distributed arrangement of conductive elements. The second electrode 122 may be a tuning electrode, and may be coupled with a second tuning circuit 136 by a conduit 146, for example a cable having a selected resistance, such as 50 ohms, for example, disposed in the shaft 144 of the substrate support 104. The second tuning circuit 136 may have a second electronic sensor 138 and a second electronic controller 140, which may be a second variable capacitor. The second electronic sensor 138 may be a voltage or current sensor, and may be coupled with the second electronic controller 140 to provide further control over plasma conditions in the processing volume 120.

A third electrode 124, which may be a bias electrode and/or an electrostatic chucking electrode, may be coupled with the substrate support 104. The third electrode may be coupled with a second source of electric power 150 through a filter 148, which may be an impedance matching circuit. The second source of electric power 150 may be DC power, pulsed DC power, RF bias power, a pulsed RF source or bias power, or a combination of these or other power sources. In some embodiments, the second source of electric power 150 may be an RF bias power. The substrate support 104 may also include one or more heating elements configured to heat the substrate to a processing temperature, which may be between about 25° C. and about 800° C. or greater.

The lid assembly 106 and substrate support 104 of FIG. 1 may be used with any processing chamber for plasma or thermal processing. In operation, the processing chamber 100 may afford real-time control of plasma conditions in the processing volume 120. The substrate 103 may be disposed on the substrate support 104, and process gases may be flowed through the lid assembly 106 using an inlet 114 according to any desired flow plan. Gases may exit the processing chamber 100 through an outlet 152. Electric power may be coupled with the gas distributor 112 to establish a plasma in the processing volume 120. The substrate may be subjected to an electrical bias using the third electrode 124 in some embodiments.

Upon energizing a plasma in the processing volume 120, a potential difference may be established between the plasma and the first electrode 108. A potential difference may also be established between the plasma and the second electrode 122. The electronic controllers 134, 140 may then be used to adjust the flow properties of the ground paths represented by the two tuning circuits 128 and 136. A set point may be delivered to the first tuning circuit 128 and the second tuning circuit 136 to provide independent control of deposition rate and of plasma density uniformity from center to edge. In embodiments where the electronic controllers may both be variable capacitors, the electronic sensors may adjust the variable capacitors to maximize deposition rate and minimize thickness non-uniformity independently.

Each of the tuning circuits 128, 136 may have a variable impedance that may be adjusted using the respective electronic controllers 134, 140. Where the electronic controllers 134, 140 are variable capacitors, the capacitance range of each of the variable capacitors, and the inductances of the first inductor 132A and the second inductor 132B, may be chosen to provide an impedance range. This range may depend on the frequency and voltage characteristics of the plasma, which may have a minimum in the capacitance range of each variable capacitor. Hence, when the capacitance of the first electronic controller 134 is at a minimum or maximum, impedance of the first tuning circuit 128 may be high, resulting in a plasma shape that has a minimum aerial or lateral coverage over the substrate support. When the capacitance of the first electronic controller 134 approaches a value that minimizes the impedance of the first tuning circuit 128, the aerial coverage of the plasma may grow to a maximum, effectively covering the entire working area of the substrate support 104. As the capacitance of the first electronic controller 134 deviates from the minimum impedance setting, the plasma shape may shrink from the chamber walls and aerial coverage of the substrate support may decline. The second electronic controller 140 may have a similar effect, increasing and decreasing aerial coverage of the plasma over the substrate support as the capacitance of the second electronic controller 140 may be changed.

The electronic sensors 130, 138 may be used to tune the respective circuits 128, 136 in a closed loop. A set point for current or voltage, depending on the type of sensor used, may be installed in each sensor, and the sensor may be provided with control software that determines an adjustment to each respective electronic controller 134, 140 to minimize deviation from the set point. Consequently, a plasma shape may be selected and dynamically controlled during processing. It is to be understood that, while the foregoing discussion is based on electronic controllers 134, 140, which may be variable capacitors, any electronic component with adjustable characteristic may be used to provide tuning circuits 128 and 136 with adjustable impedance.

Figure 2:
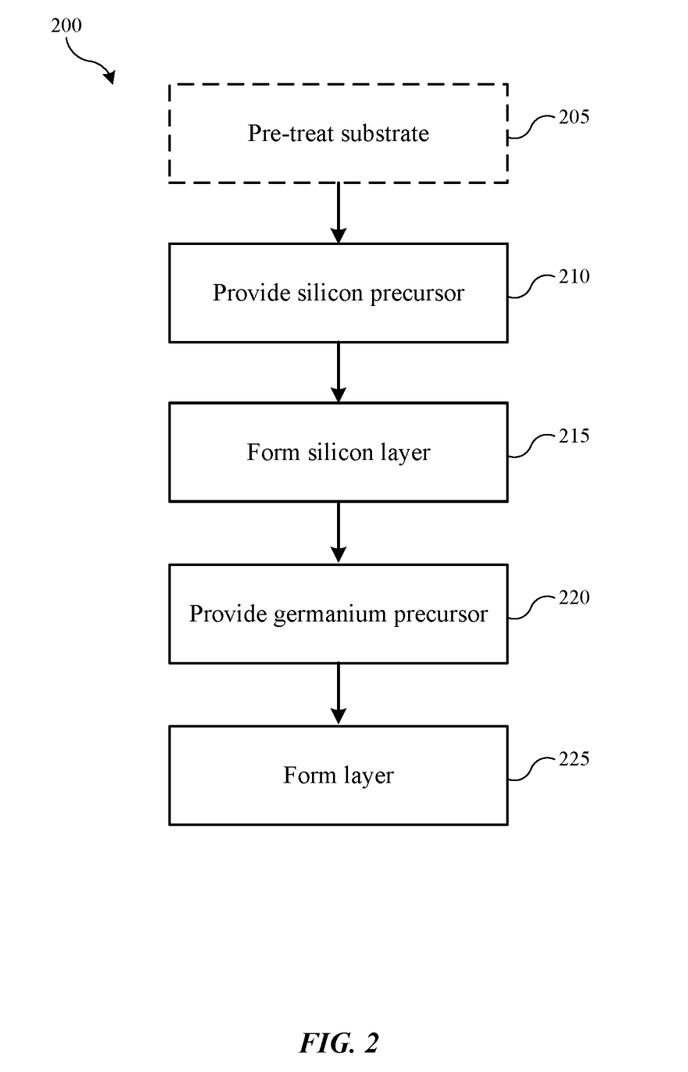
FIG. 2 shows operations in a semiconductor processing method according to some embodiments of the present technology.

As discussed previously, although a plasma-processing chamber may be used for one or more aspects of film processing, in some embodiments forming silicon and germanium films may not utilize a plasma-enhanced process for some or all of the operations, which may improve conformality of the film produced. The present technology may at least form film layers without plasma generation, in some embodiments. FIG. 2 shows exemplary operations in a processing method 200 according to some embodiments of the present technology. The method may be performed in a variety of processing chambers, including processing chamber 100 described above, as well as any other chambers including non-plasma chambers, in which the operations may be performed. Method 200 may include one or more operations prior to the initiation of the method, including front-end processing, deposition, etching, polishing, cleaning, or any other operations that may be performed prior to the described operations. The methods may include a number of optional operations, which may or may not be specifically associated with some embodiments of methods according to embodiments of the present technology. For example, many of the operations are described in order to provide a broader scope of the processes performed, but are not critical to the technology, or may be performed by alternative methodology as will be discussed further below. Method 200 may describe operations shown schematically in FIGS. 3A-3C, the illustrations of which will be described in conjunction with the operations of method 200. It is to be understood that the figures illustrate only partial schematic views, and a substrate may contain any number of additional materials and features having a variety of characteristics and aspects as illustrated in the figures.

Figure 3A:
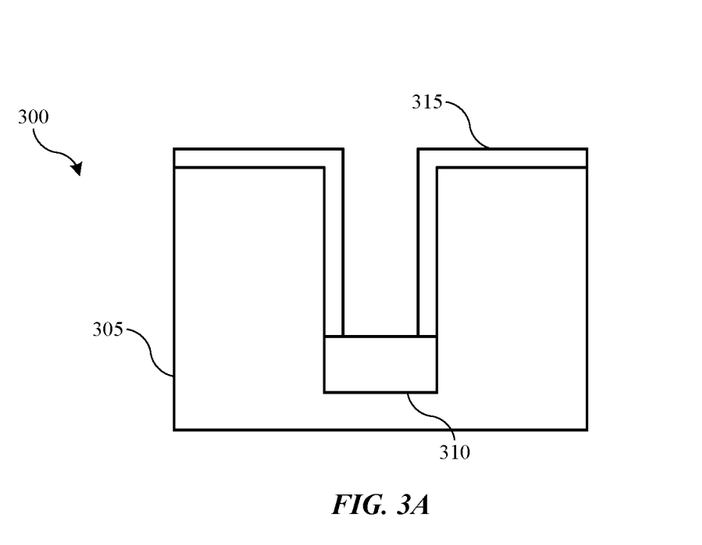
FIGS. 3A-3C show exemplary schematic cross-sectional structures in which material layers are included produced according to some embodiments of the present technology.

Method 200 may or may not involve optional operations to develop the semiconductor structure to a particular fabrication operation. It is to be understood that method 200 may be performed on any number of semiconductor structures or substrates 305, as illustrated in FIG. 3A, including exemplary structures on which a silicon-germanium material may be formed. As illustrated in FIG. 3A substrate 305 may be processed to form one or more recesses or features, such as trenches, apertures, or any other structure in semiconductor processing. Substrate 305 may be any number of materials, such as a base wafer or substrate made of silicon or silicon-containing materials, germanium, other substrate materials, as well as one or more materials that may be formed overlying the substrate during semiconductor processing. For example, in some embodiments the substrate may be processed to include one or more materials or structures for semiconductor processing. Substrate 305 may be or include a dielectric material, such as an oxide or nitride of any number of materials, and features or recesses formed may provide access to one or more underlying materials 310. Material 310 may be a metal or any other material to be accessed during processing. For example, material 310 may be a metal plug of cobalt, tungsten, or any number of other metals, including transition metals, which may be formed in any structure. Additionally, in some embodiments, the recess may include a liner 315, which may extend along sidewalls of the substrate 305. Liner 315 may be an oxide or nitride liner, such as silicon oxide, silicon nitride, as well as a transition metal nitride or oxide in some embodiments. Although only one feature is shown in the figure, it is to be understood that exemplary structures may have any number of features defined along the structure according to embodiments of the present technology.

The aspect ratio of the features, or the ratio of the depth of the feature relative to the width or diameter of the feature formed, may be greater than or about 2:1, and may be greater than or about 3:1, greater than or about 4:1, greater than or about 5:1, greater than or about 6:1, greater than or about 7:1, greater than or about 8:1, greater than or about 9:1, greater than or about 10:1, or more. A plasma-deposited layer may be incapable of sufficiently accessing deeper within the trench, and pinch off may occur at the top of the feature. However, silicon-and-germanium films produced by the present technology may be characterized by coverage fully through the structure. For example, a thickness of the film along sidewalls nearer the top of the structure and a thickness of the film along sidewalls nearer the bottom of the structure may be substantially the same, where the film produced is substantially conformal. Accordingly, in some embodiments the film deposited may be characterized by a conformality or a similarity of thickness formed between any two regions along a sidewall or base of a feature or along the film formed of greater than or about 80%. In some embodiments, the conformality may be greater than or about 85%, greater than or about 90%, greater than or about 92%, greater than or about 94%, greater than or about 96%, greater than or about 98%, or higher. Accordingly, the present technology may produce silicon-germanium films that may be incorporated in a number of semiconductor processes for which conformality may be achieved, and which may limit air gap and void formation.

As explained previously, germanium may be less likely to form on some materials, which may produce segments of formation instead of conformal coverage. For example, dielectric materials such as may be used in substrate 305 or liner 315 may challenge conformal coverage, where germanium may more readily nucleate on other germanium sites, which may lead to voids in the coverage. Accordingly, the present technology may form a seeding layer of silicon or a silicon-containing material, which may improve germanium nucleation, and increase conformal coverage.

To increase silicon adhesion and nucleation, in some embodiments method 200 may include a pre-treatment at optional operation 205. By pre-treating the surface of the substrate, adhesion of the film may be improved by producing favorable terminations along the substrate or material on which deposition may be performed. The pre-treatment may be or include a thermal process, or may include a plasma-enhanced process. The treatment may include delivery of a hydrogen-containing precursor, a nitrogen-containing precursor, or some other precursor, which may flow to contact or interact with exposed surfaces on the substrate. Exemplary precursors may include delivery of one or more of hydrogen, nitrogen, ammonia, or other hydrogen-containing or nitrogen-containing precursors, among other materials that may pre-treat the substrate. The precursor or precursors may be delivered to the processing region of the chamber, and a plasma may be formed. The substrate may be contacted with plasma effluents of the precursors, and favorable terminations may be produced. Regardless of whether the liner 315 may be or include an oxide material, many materials may additionally include a superficial oxidation layer due to atmospheric exposure at some point during processing. By performing a pre-treatment, hydroxyl terminations may be removed or replaced with more favorable nitrogen-containing or hydrogen-containing terminations.

While the pre-treatment may be or include a plasma-enhanced operation, when performed, in some embodiments the deposition operations or formation operations may be performed while maintaining the processing region of the semiconductor processing chamber plasma free. Accordingly, in some embodiments the method may include halting the plasma formation subsequent the pre-treatment operation. In some embodiments, none or the other noted operations of method 200 may be performed with plasma generation, and the remaining operations may be performed as a thermal process. During the pre-treatment, a plasma power may be maintained sufficiently high to provide increased radical generation and energy, which may improve surface termination control. For example, the plasma may be generated at a power greater than or about 500 W, and may be generated at a power greater than or about 600 W, greater than or about 700 W, greater than or about 800 W, greater than or about 900 W, greater than or about 1000 W, or higher.

Figure 3B:
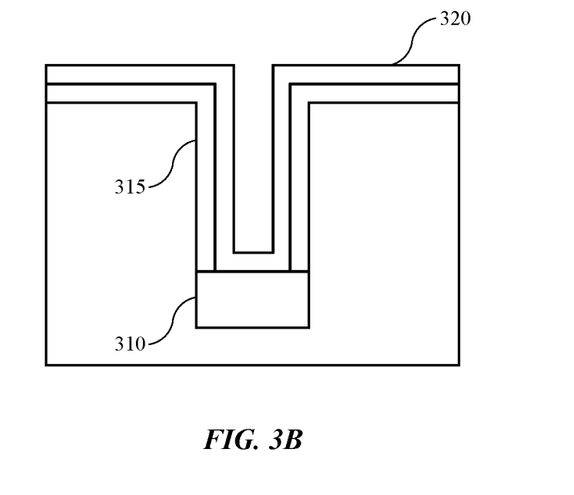

At operation 210, the method may include providing a silicon-containing precursor to the processing region of a semiconductor processing chamber where the substrate may be housed. The processing chamber may be the same or a different chamber from the chamber in which a pre-treatment may be performed. The silicon-containing precursor may be flowed into the processing region to contact the substrate, as well as treated surfaces, when they are produced. A layer of silicon-containing material, which may be silicon, including amorphous silicon, may be formed or deposited along the substrate at operation 215. As illustrated in FIG. 3B, the silicon-containing layer 320 may extend along any and/or all exposed surfaces along the substrate, including along liner material 315, substrate material 305, when exposed, as well as other incorporated materials, such as material 310, which may be a metal in some embodiments. The process may be performed for a period of time sufficient to produce an amount of coverage across the surface, which may operate as a seeding layer for subsequent silicon-germanium growth.

Figure 3C:
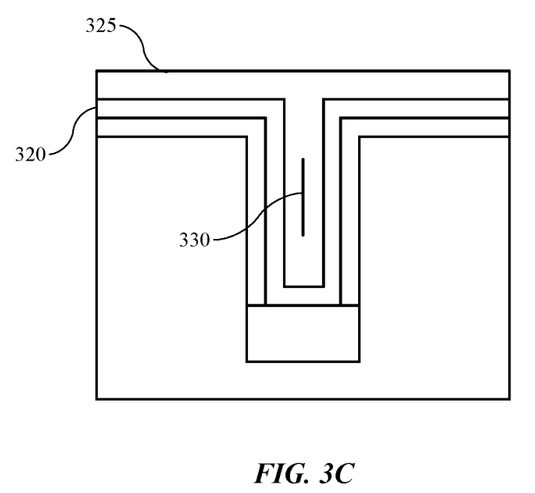

At operation 220, which may occur subsequent a first period of time during which the seeding layer is produced, a germanium-containing precursor may be provided to the processing region of the semiconductor processing chamber. At operation 225, the silicon-containing precursor and the germanium-containing precursor may be thermally reacted within the processing region of the semiconductor processing chamber, which may form a silicon-and-germanium-containing layer on the substrate. As illustrated in FIG. 3C, silicon-germanium material 325 may form or deposit along exposed regions of silicon-containing layer 320. This may afford a more conformal growth of the germanium-containing material, which may limit any airgap or void formation. Although a seam 330 may be produced during some embodiments of the present technology, the layer may be substantially continuous through the feature, and minimal or limited airgap formation may occur. Because a seeding layer of a material having higher germanium affinity may be formed along the structure, gap-free coverage may be produced along the sidewalls of the features along the substrate.

Because of the reaction being performed in some embodiments, the semiconductor processing chamber, the pedestal, or the substrate may be maintained at a temperature greater than or about 400° C., This may ensure decomposition of the silicon-containing precursor and the germanium-containing precursor, and in some embodiments a temperature may be maintained at a temperature that is greater than or about 450° C., greater than or about 500° C., greater than or about 520° C., greater than or about 540° C., greater than or about 560° C., greater than or about 580° C., greater than or about 600° C., or higher.

As previously discussed, some or all of the formation operations may be performed while the substrate processing region is maintained plasma-free. By performing a thermal chemical-vapor deposition, a more conformal material formation may be produced. Non-limiting examples of silicon-containing precursors that may be used during processing according to some embodiments of the present technology may include silane, disilane, silicon tetrafluoride, silicon tetrachloride, dichlorosilane, tetraethyl orthosilicate, as well as any other silicon-containing precursors that may be used in silicon-containing film formation. Germanium-containing precursors may include any number of germanium materials, such as germane, other organo-germanium precursors such as tetramethylgermanium, tributylgermanium hydride, triethylgermanium hydride, or triphenylgermanium hydride, halogen-germanium precursors, such as germanium fluoride, or any other germanium-containing precursor. Additional materials that may be flowed with the precursors may be or include diatomic hydrogen, nitrogen, argon, helium, or any number of other carrier gases that may be added with one or both of the silicon-containing precursor and the germanium-containing precursor.

The layers of material may be formed to any thickness in embodiments of the present technology, although the silicon-containing layer may be formed to reduced thickness, which may ensure a complete coverage for germanium seeding, without largely altering properties of the overall film being produced. For example, in some embodiments the silicon-containing layer may be formed to a thickness of less than or about 20 Å, and may be formed to a thickness of less than or about 15 Å, less than or about 10 Å, less than or about 5 Å, or less, such as a few monolayers of material, which may provide a complete coverage of the surface, while limiting impact on film characteristics. To control formation of the silicon-containing layer, temperature may be reduced, which may control the rate of formation of the film. For example, while any of the previously noted temperatures may be used, by performing the silicon-containing layer deposition at a temperature below or about 500° C., for example, the silicon-containing layer may be formed more slowly. The first period of time during which the silicon-containing layer may be produced may be less than or about 60 seconds, and may be less than or about 50 seconds, less than or about 40 seconds, less than or about 30 seconds, less than or about 20 seconds, less than or about 10 seconds, or less, in some embodiments of the present technology.

Subsequent the first period of time, the germanium-containing precursor may be provided to the processing region. A flow of the silicon-containing precursor may be maintained during the delivery of the germanium-containing precursor, or may be altered, such as by increasing or decreasing the flow rate. For example, while a flow of the silicon-containing precursor may be continued after the first period of time, the germanium-containing precursor may simply be added to the flow of the silicon-containing precursor. Additionally, in some embodiments a flow rate of the silicon-containing precursor may be increased or decreased at the time the germanium-containing precursor is provided.

For example, a minimum flow rate of the germanium-containing precursor may be provided to ensure adequate formation and conformality is achieved during the deposition. However, such as when a film characterized by a lower germanium incorporation may be sought, the flow rate of the silicon-containing precursor may be increased, which may further dilute the germanium-containing precursor. This may allow a controlled growth of the seed or initiation layer, while also providing control over the germanium incorporation in the film. Accordingly, in some embodiments of the present technology, a germanium concentration may be controlled to be less than, greater than or about 5%, and may be controlled to be greater than or about 10%, greater than or about 15%, greater than or about 20%, greater than or about 25%, greater than or about 30%, greater than or about 35%, greater than or about 40%, or higher.

When a pre-treatment operation is performed, such as a plasma pre-treatment, other chamber conditions may be adjusted prior to the thermal deposition operations. For example, during plasma pre-treatment, a relatively lower pressure may be maintained in the processing region, which may increase a mean-free path of plasma effluents, and facilitate delivery into higher aspect-ratio structures. However, subsequent the plasma processing, the pressure may be increased in some embodiments for the thermal deposition operations, which may include delivery of either or both of the silicon-containing precursor or the germanium-containing precursor, such as during formation of either or both of the seeding layer or the bulk layer. Increasing the pressure during thermal deposition may help ensure non-plasma enhanced precursors may access higher aspect-ratio structures and provide adequate flux of materials across all surfaces on which deposition may be sought. Accordingly, in some embodiments a pressure during a pre-treatment operation may be maintained at less than or about 12 Torr, and may be maintained at less than or about 10 Torr, less than or about 8 Torr, less than or about 6 Torr, less than or about 4 Torr, less than or about 2 Torr, or less. During delivery of either deposition precursor, or during some or all of operation 210 through operation 225 pressure may be increased to greater than or about 10 Torr, and may be increased to greater than or about 50 Torr, greater than or about 100 Torr, greater than or about 150 Torr, greater than or about 200 Torr, greater than or about 250 Torr, greater than or about 300 Torr, greater than or about 350 Torr, greater than or about 400 Torr, or higher.

Similarly, in some embodiments the substrate may be maintained at a first distance from a faceplate within the semiconductor processing chamber during a pre-treatment operation, such as a plasma pre-treatment, and then moved to a second distance from the faceplate during the deposition operations. For example, because plasma generation may occur in the processing region of the processing chamber, the substrate may be maintained at a distance from the faceplate to facilitate generation of plasma, as well as lateral or radial flow within the processing region, such as at lower processing pressure. Subsequent the pre-treatment, the substrate may be repositioned in some embodiments, either closer to or further from the faceplate. For example, in some embodiments the substrate may be moved closer to the faceplate, which may facilitate deposition, as well as flow within structures formed across the substrate. This may limit temperature fluctuations within the processing chamber, and ensure deposition may occur more conformally along features. By performing silicon-germanium deposition according to embodiments of the present technology, conformal coverage may be produced across any number of high-aspect-ratio features.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursor, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing method comprising:
providing a silicon-containing precursor to a processing region of a semiconductor processing chamber, wherein a substrate is disposed within the processing region of the semiconductor processing chamber;
depositing a silicon-containing material on the substrate;
subsequent a first period of time, providing a germanium-containing precursor to the processing region of the semiconductor processing chamber while maintaining a flow rate of the silicon-containing precursor;
increasing the flow rate of the silicon-containing precursor while providing the germanium-containing precursor;
thermally reacting the silicon-containing precursor and the germanium-containing precursor at a temperature greater than or about 400° C.; and
forming a silicon-and-germanium-containing layer on the substrate.

2. The semiconductor processing method of claim 1, wherein the processing region of the semiconductor processing chamber is maintained plasma-free while forming the silicon-and-germanium-containing layer on the substrate.

3. The semiconductor processing method of claim 1, wherein the first period of time is less than or about 60 seconds.

4. The semiconductor processing method of claim 1, wherein thermally reacting the silicon-containing precursor and the germanium-containing precursor is performed at a temperature greater than or about 500° C.

5. The semiconductor processing method of claim 1, further comprising, prior to providing the silicon-containing precursor:
forming a plasma of a treatment precursor; and
contacting the substrate with plasma effluents of the treatment precursor.

6. The semiconductor processing method of claim 5, wherein the treatment precursor comprises at least one of a hydrogen-containing precursor or a nitrogen-containing precursor.

7. The semiconductor processing method of claim 5, further comprising:
halting formation of the plasma prior to providing the silicon-containing precursor to the processing region.

8. The semiconductor processing method of claim 5, further comprising:
increasing a pressure within the semiconductor processing chamber prior to or while providing the silicon-containing precursor to the processing region.

9. The semiconductor processing method of claim 5, further comprising:
reducing a distance between the substrate and a faceplate within the semiconductor processing chamber prior to or while providing the silicon-containing precursor to the processing region.

10. A semiconductor processing method comprising:
forming a plasma of a treatment precursor;
contacting a substrate with plasma effluents of the treatment precursor, wherein the substrate is disposed within a processing region of a semiconductor processing chamber;
providing a silicon-containing precursor to the processing region of the semiconductor processing chamber;
subsequently providing a germanium-containing precursor to the processing region of the semiconductor processing chamber;
reacting the silicon-containing precursor and the germanium-containing precursor within the processing region of the semiconductor processing chamber; and
forming a silicon-and-germanium-containing layer on the substrate.

11. The semiconductor processing method of claim 10, wherein the processing region of the semiconductor processing chamber is maintained plasma-free while providing the silicon-containing precursor and while providing the germanium-containing precursor.

12. The semiconductor processing method of claim 10, further comprising:
maintaining delivery of the silicon-containing precursor while providing the germanium-containing precursor.

13. The semiconductor processing method of claim 10, wherein the germanium-containing precursor is provided after at least about 5 seconds subsequent providing the silicon-containing precursor.

14. The semiconductor processing method of claim 10, further comprising:
increasing a flow rate of the silicon-containing precursor when providing the germanium-containing precursor.

15. The semiconductor processing method of claim 10, wherein the semiconductor processing method is performed at a temperature within the processing region of greater than or about 400° C.

16. The semiconductor processing method of claim 10, further comprising:
increasing a pressure within the semiconductor processing chamber prior to or while providing the silicon-containing precursor to the processing region.

17. A semiconductor processing method comprising:
forming a plasma of a treatment precursor;
contacting a substrate with plasma effluents of the treatment precursor, wherein the substrate is disposed within a processing region of a semiconductor processing chamber;
providing a silicon-containing precursor to the processing region of the semiconductor processing chamber;
forming a layer of silicon-containing material on the substrate;
subsequent a first period of time, providing a germanium-containing precursor to the processing region of the semiconductor processing chamber while maintaining a flow rate of the silicon-containing precursor;
reacting the silicon-containing precursor and the germanium-containing precursor within the processing region of the semiconductor processing chamber; and
forming a silicon-and-germanium-containing layer on the substrate overlying the layer of silicon-containing material.

18. The semiconductor processing method of claim 17, wherein the processing region of the semiconductor processing chamber is maintained plasma-free while providing the silicon-containing precursor and while providing the germanium-containing precursor.

19. The semiconductor processing method of claim 17, wherein the first period of time is less than or about 60 seconds.

* * * * *